(12) United States Patent
Hama et al.

(10) Patent No.: US 7,998,370 B2
(45) Date of Patent: Aug. 16, 2011

(54) CONDUCTIVE PASTE AS WELL AS CONDUCTIVE COATING AND CONDUCTIVE FILM PREPARED FROM SAME

(75) Inventors: Nobuyuki Hama, Shiga (JP); Yasuaki Takeda, Shiga (JP); Koji Moriuchi, Shiga (JP)

(73) Assignee: I.S.T. Corporation, Shiga (JP)

( * ) Notice: Subject to any disclaimer, the term of this patent is extended or adjusted under 35 U.S.C. 154(b) by 417 days.

(21) Appl. No.: 12/376,394

(22) PCT Filed: Aug. 3, 2007

(86) PCT No.: PCT/JP2007/065293
§ 371 (c)(1),
(2), (4) Date: Feb. 4, 2009

(87) PCT Pub. No.: WO2008/016148
PCT Pub. Date: Feb. 7, 2008

(65) Prior Publication Data
US 2010/0193748 A1  Aug. 5, 2010

(30) Foreign Application Priority Data

Aug. 4, 2006 (JP) ................. 2006-212782
Aug. 30, 2006 (JP) ................. 2006-233455

(51) Int. Cl.
*H01B 1/02* (2006.01)
*H01B 1/22* (2006.01)
*C08G 18/08* (2006.01)
*C08F 2/44* (2006.01)

(52) U.S. Cl. ......... 252/513; 252/514; 524/779; 524/785
(58) Field of Classification Search ............... 252/513, 252/514; 524/779, 785
See application file for complete search history.

(56) References Cited

U.S. PATENT DOCUMENTS

| | | | |
|---|---|---|---|
| 5,882,722 A | 3/1999 | Kydd | |
| 6,083,426 A * | 7/2000 | Shimasaki et al. | 252/500 |
| 6,406,746 B1 * | 6/2002 | Date et al. | 427/213.33 |
| 6,666,994 B2 * | 12/2003 | Takezawa et al. | 252/518.1 |
| 2008/0050513 A1 * | 2/2008 | Wang et al. | 427/67 |

FOREIGN PATENT DOCUMENTS

| | | |
|---|---|---|
| JP | S60-118745 A | 6/1985 |
| JP | H02-167741 A | 6/1990 |
| JP | H02-245071 A | 9/1990 |
| JP | 11-007830 A | 1/1999 |
| JP | 2004-039379 A | 2/2004 |

* cited by examiner

*Primary Examiner* — Mark Kopec
*Assistant Examiner* — Jaison Thomas
(74) *Attorney, Agent, or Firm* — Global IP Counselors, LLP

(57) ABSTRACT

The task of the present invention is to offer a conductive paste that can be molded into a conductive coating or film that can maintain flexibility and ductility even while possessing a thickness of 50 μm~125 μm. The conductive paste of the present invention includes a conductive particulate, a metal capture agent and a polyimide precursor solution. The metal capture agent can be selected as at least one from among either pyrimidinethiol compounds, triazinethiol compounds and imidazole compounds with a mercapto group. Moreover, the conductive particulate is preferably a core particle that is covered with a metal shell. In addition, a polyamic acid solution is preferred as the polyimide precursor solution.

10 Claims, No Drawings

CONDUCTIVE PASTE AS WELL AS CONDUCTIVE COATING AND CONDUCTIVE FILM PREPARED FROM SAME

CROSS-REFERENCE TO RELATED APPLICATIONS

This U.S. National stage application claims priority under 35 U.S.C. §119(a) to Japanese Patent Application No. 2006-212782, filed in Japan on Aug. 4, 2006, and Japanese Patent Application No. 2006-233455, filed in Japan on Aug. 30, 2006, the entire contents of which are hereby incorporated herein by reference.

TECHNICAL FIELD

The present invention relates to a conductive paste. Moreover, the present invention relates to a conductive coating and conductive film with an excellent flexibility and bending resistance made from a conductive paste and being imidized.

BACKGROUND ART

A conductive paste is a paste that contains a metal micropowder as the main conductive material in a binder resin such as polyamide-imide, poly(ether ether ketone), epoxy resin, phenolic resin or the like, that is used as an raw material for electrically-conducting path, for example when formed into the electrically-conducting circuit of a printed wiring board. Moreover, in double-sided printed wiring boards and build-up multilayer printed wiring boards, through-holes are filled with a conductive silver paste to connect the wiring patterns of each layer. It is also known that a conductive paste can be used to form a thick film conductor circuit on a ceramic substrate.

For example, a conductive ink is proposed in U.S. Pat. No. 5,882,722, where a metal powder and a metallo-organic decomposition (MOD) compound are dispersed in an organic liquid vehicle. This conductive ink can be printed onto a printed wiring board or flexible printed wiring board using screen printing, gravure printing or the like. When an MOD compound like silver neodecanoate is heated to a temperature on the order of 200 degrees C., decomposition begins and the metal precipitates. Since the precipitated metal has a small particle size, it is highly activated, and furthermore can undergo sintering at relatively low temperatures. When this conductive ink is printed onto the substrate and is fired at a temperature less than 450 degrees C., the metal precipitated from the MOD compound promotes bonding within the metal powder and bonding to the substrate to form the conductive metallic coating.

Nevertheless, since this type of conductive ink is constituted substantially from silver alone, the conductive coating obtained has inadequate flexibility, and with a thick film the bending resistance will be lowered.

In order to improve the inadequate flexibility of this conductive coating, for example, in Japanese Published Unexamined Patent Application No. 2004-039379, a silver-containing organic compound is used that possesses a constitution wherein the silver atoms and the organic component are bonded through a heteroatom, but the layer thickness exhibited in the working example is a maximum of 25 μm, and there is the additional problem that the silver-containing organic compound generates hydrogen carbide and carbon dioxide gas during firing.

Additionally, as described in the present comparative examples, when a silver-containing conductive paste is manufactured using a polyimide precursor used as the binder resin that is polymerized from an aromatic tetracarboxylic acid dianhydride and an aromatic diamine in a polar organic solvent this type of conductive paste becomes a flocculent type powder as the imidization progresses, and there is a problem in that no coating is obtained, let alone any film.

SUMMARY OF THE INVENTION

Problem to be Solved by the Invention

The task of the present invention is to solve the many problem points possessed by the abovementioned conventional conductive pastes and by films and coatings obtained therefrom, to offer a conductive paste that maintains ductility and flexibility and that combines superior polyimide characteristics, high conductivity and adhesiveness even when they are molded with a larger thickness (specifically, a coating thickness of 50 μm~125 μm). Moreover, another task of the present invention is to offer a conductive film obtained by imidization of the conductive paste as well as a method for its utilization.

Means to Solve the Problem

The present inventors, taking into account the results of a careful examination, discovered that they were able to solve the abovementioned problems with the conductive paste such as that below. In other words, the object of the present invention is as below. The conductive paste of the present invention contains, at least, conductive particles, a metal capture agent and a polyimide precursor solution. The metal capture agent is at least one from among a pyrimidinethiol compound represented in Chemical Formula (1) shown below, a triazinethiol compound represented in Chemical Formula (2) shown below, and an imidazole compound with a mercapto group. Furthermore, the imidazole compound with a mercapto group functions not only as a metal capture agent, but also as imidization agent. On this point, the more preferred compound can be said to be an imidazole compound with a mercapto group.

Chemical formula 1

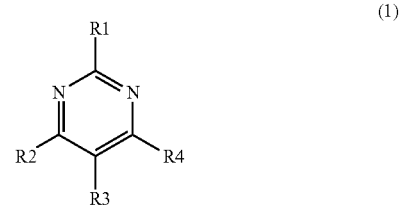

(1)

(where in Formula (1), at least one from among R1, R2, R3 and R4 is S—H or S-M, and M is a metal or substituted or unsubstituted ammonium).

Chemical formula 2

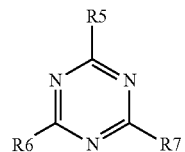

(2)

(where in Formula (2), at least one from among R5, R6 and R7 is S—H or S-M, and M is a metal or substituted or unsubstituted ammonium).

Furthermore, in the present invention, the imidazole compound with a mercapto group is preferably at least one selected from the group consisting of 2-mercaptobenzimidazole (2MBZ), 2-mercapto imidazole, 2-mercapto-1-methylimidazole (2MMZ), 2-mercapto-5-methylimidazole, 5-amino-2-mercaptobenzimidazole, 2-mercapto-5-nitrobenzimidazole, 2-mercapto-5-methoxybenzimidazole and 2-mercaptobenzimidazole-5-carboxylic acid.

Furthermore, in the present invention, the conductive particulate is preferably formed with a core particle and a metal shell covering the core particles. In addition, the metal shell is preferably formed from silver. Additionally, the core particle is preferably at least one particle selected from the group consisting of carbon, glass and ceramic.

In addition, in the present invention, the additive amount of the metal capture agent is preferably 0.01 wt % to 10 wt % based on the solids content of the polyimide precursor solution.

Additionally, the conductive coating or film of the present invention is formed from the conductive paste, and is heat treated. Furthermore, in a conductive coating or film molded in this manner, the conductive particles that are in a state of being captured in the metal capture agent are dispersed in the polyimide resin.

Moreover, in the present invention, it is preferable for the conductive coating or film to have a volume resistivity of $\leqq 2 \times 10^{-6}$ Ω·cm and $<1 \times 10^2$ Ω·cm.

Effect of the Invention

The present inventors, taking into account the results of a careful examination, have clarified that if the conductive paste of the present invention is used as the raw material, a conductive coating or film is obtained that can have a larger thickness (specifically, a coating thickness of 50 μm~125 μm), which is ductile and has high flexibility. Then, a polyimide precursor solution is used for the binder resin in this conductive paste. For this reason, if this conductive paste is the raw material, it is possible to mold a smooth and tough conductive coating or film that has superior heat resistance, mechanical properties and adhesiveness with other materials. Furthermore, in this conductive paste, the conductive particles are not metal particles but may be conductive particles in which core particles of the relatively less expensive carbon, glass, ceramic and the like are covered with a metal shell. For this reason, if the conductive paste of the present invention is used as a raw material, the amount of high-cost metals used such as silver and the like is reduced. Consequently, it is possible to greatly reduce the manufacturing costs for the conductive coating or film if the conductive paste of the present invention is used as a raw material.

DETAILED DESCRIPTION OF THE INVENTION

The conductive paste that relates to the present invention is explained in further detail below. The conductive paste of the present invention contains a conductive particulate, a metal capture agent and a polyimide precursor solution. This conductive paste can be manufactured by a general preparation method where, after producing the polyimide precursor solution beforehand, a conductive particulate is mixed in the polyimide precursor solution, and next the metal capture agent dissolved in a solvent is added into the polyimide precursor solution. In addition, for the above-mentioned polyimide precursor solution, preferably a diamine or its derivative and a tetracarboxylic acid dianhydride or its derivative are allowed to react in a polar solvent (polyamic acid solution).

The conductive particulate in the present invention is preferably a metal particulate with high conductivity such as platinum, gold, silver, nickel, palladium or the like, and a conductive particulate wherein a core particle is covered with a metal shell (below referred to as "core-shell conductive particulate") is more preferred. Furthermore, when the conductive particulate is a core-shell conductive particulate, it is possible to design a low-cost and lightweight paste material. Additionally, in the core-shell conductive particulate, there are no particular limitations on the core particles, but from the cost viewpoint and from the perspective of heat resistance characteristics and the like, an inorganic particulate of carbon, glass, ceramic or the like is preferred. Moreover, any desired form can be used for the inorganic particulate, such as a scale form, needle form, dendritic form or the like. In addition, for this inorganic particulate, from the perspectives of dispersibility and stability when mixed with the polyimide precursor solution, and being lightweight, a particulate with a hollow form or foam form is more preferred. Additionally, for the metal shell, it is preferable for $\geqq 80\%$ of the surface area of the inorganic particulate that is the core particle to be covered with silver. Moreover, for the metal shell, it is more preferred for $\geqq 90\%$ of the surface area of the inorganic particulate that is the core particle to be covered, and still further preferred for $\geqq 95\%$ to be covered. If the core particle coverage with the metal shell is $<80\%$, the conductivity will thereby be lowered. It is satisfactory for the metal shell to be of one layer, and also to be $\geqq 2$ layers. In addition, within the scope that is not detrimental to the essence of the present invention, it is satisfactory for the remaining surface of the core particle to be covered with another conductive metal. Examples of other conductive metals that can be named include the noble metals such as platinum, gold, palladium and the like, and the base metals such as molybdenum, nickel, cobalt, iron, copper, zinc, tin, antimony, tungsten, manganese, titanium, vanadium, chromium and the like.

Next, an average particle diameter of the core-shell conductive particulate of $\geqq 1$ μm and 50 μm is preferred. With an average particle diameter of the core-shell conductive particulate of $\geqq 1$ it is more difficult for the core-shell conductive particulate to flocculate, which is desirable. Additionally, with an average particle diameter of the core-shell conductive particulate of $\leqq 50$ μm, the surface roughness of the coating or film obtained does not become larger, which is desirable.

Examples of methods for forming a metal shell onto the inorganic particulate that is the core particle that can be named, without being limiting in any particular way, include electrolytic plating, non-electrolytic plating, vacuum deposition, sputtering and the like.

Moreover, examples of metal capture agents that can suitably be used in the present invention that can be named include pyrimidinethiol compounds represented by Chemical Formula (1) shown below, triazinethiol compounds represented by Chemical Formula (2) shown below, or imidazole compounds with a mercapto group. Furthermore, an imidazole compound with a mercapto group can also function as an imidization agent.

Chemical formula 1

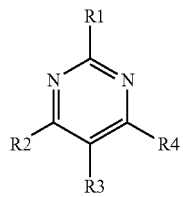

(1)

(where in formula (1), at least one from among R1, R2, R3 and R4 is S—H or S-M, and M is a metal or substituted or unsubstituted ammonium).

Chemical formula 2

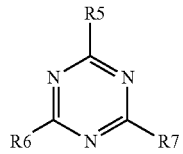

(2)

(where in Formula (2), at least one from among R5, R6 and R7 is S—H or S-M, and M is a metal or substituted or unsubstituted ammonium).

Pyrimidinethiol compounds, without being limiting in any particular way, can be compounds that have a pyrimidine skeleton and possess at least one S—H (thiol) or S-M (thiolate metal salt, or substituted or unsubstituted ammonium salt). In addition, examples of the metal atom, without being limiting in any particular way, include an alkali metal such as lithium, sodium, potassium and the like, an alkaline earth metal such magnesium, calcium and the like, or copper and the like. Then, specific examples of pyrimidinethiol compounds that can be named include 2-mercaptopyrimidine (2MP), 2-hydroxy-4-mercaptopyrimidine, 4-hydroxy-2-mercaptopyrimidine, 2,4-diamino-6-mercaptopyrimidine, 4,6-diamino-2-mercaptopyrimidine, 4-amino-6-hydroxy-2-mercaptopyrimidine, 2-thiobarbituric acid, 4-hydroxy-2-mercapto-6-methylpyrimidine, 4,6-dimethyl-2-pyrimidinethiol (DMPT), 4,5-diamino-2,6-dimercaptopyrimidine, 4,5-diamino-6-hydroxy-2-mercaptopyrimidine and the like. Furthermore, such pyrimidinethiol compounds can optionally be used either individually or in combination.

Triazinethiol compounds, without being limiting in any particular way, can be compounds that have a triazine skeleton and possess at least one S—H (thiol) or S-M (thiolate metal salt, or substituted or unsubstituted ammonium salt). Examples of the metal atom, without being limiting in any particular way, include an alkali metal such as lithium, sodium, potassium and the like, an alkaline earth metal such magnesium, calcium and the like, or copper and the like. Then, specific examples of triazinethiol compounds that can be named include 2-amino-1,3,5-triazine-4,6-dithiol (ATDT), 2-(di-n-butylamino)-4,6-dimercapto-1,3,5-triazine (DBDMT), 2-phenylamino-4,6-dimercapto-1,3,5-triazine, trithiocyanuric acid (TTCA), trithiocyanuric acid monosodium salt, trithiocyanuric acid trisodium salt, (TTCA-3Na) and the like. Furthermore, such triazinethiol compounds can optionally be used either individually or in combination.

Specific examples of imidazole compounds with a mercapto group that can be named include 2-mercaptobenzimidazole, 2-mercaptoimidazole, 2-mercapto-1-methylimidazole, 2-mercapto-5-methylimidazole, 5-amino-2-mercaptobenzimidazole, 2-mercapto-5-nitrobenzimidazole, 2-mercapto-5-methoxybenzimidazole, 2-mercaptobenzimidazole-5-carboxylic acid and the like. Further, such imidazole compounds with a mercapto group can optionally be used either individually or in combination.

Next, the polyimide precursor solutions that can suitably be used in the present invention include polyamic acid solutions with a viscosity <1,000 poise. If the viscosity of the polyimide precursor solution is ≧1,000 poise, it will be more difficult for the abovementioned conductive particulate to be uniformly dispersed, and this is not desirable.

For the manufacturing method for the polyimide precursor solution, without being limiting in any particular way, a satisfactory method is for a diamine or its derivative and a tetracarboxylic acid dianhydride or its derivative to be allowed to react in a polar solvent.

Examples of diamines that are suitable for use in the present invention that can be named include aromatic diamines such as para-phenylene diamine (PPD), meta-phenylene diamine (MPDA), 2,5-diaminotoluene, 2,6-diaminotoluene, 4,4'-diaminobiphenyl, 3,3'-dimethyl-4,4'-diaminobiphenyl, 3,3'-dimethoxy-4,4'-diaminobiphenyl, 2,2'-bis(trifluoromethyl)-4,4'-diaminobiphenyl, 3,3'-diaminodiphenylmethane, 4,4'-diaminodiphenylmethane (MDA), 2,2-bis-(4-aminophenyl)propane, 3,3'-diaminodiphenylsulfone (33DDS), 4,4'-diaminodiphenylsulfone (44DDS), 3,3'-diaminodiphenylsulfide, 4,4'-diaminodiphenylsulfide, 3,3'-diaminodiphenyl ether, 3,4'-diaminodiphenyl ether (34ODA), 4,4'-diaminodiphenyl ether (ODA), 1,5-diaminonaphthalene, 4,4'-diaminodiphenyldiethylsilane, 4,4'-diaminodiphenylsilane, 4,4'-diaminodiphenylethylphosphine oxide, 1,3-bis-(3-aminophenoxy)benzene (133APB), 1,3-bis-(4-aminophenoxy)benzene (134APB), 1,4-bis-(4-aminophenoxy)benzene, bis-[4-(3-aminophenoxy)phenyl]sulfone (BAPSM), bis-[4-(4-aminophenoxy)phenyl]sulfone (BAPS), 2,2-bis-[4-(4-aminophenoxy)phenyl]propane (BAPP), 2,2-bis-(3-aminophenyl)-1,1,1,3,3,3-hexafluoropropane, 2,2-bis-(4-aminophenyl)-1,1,1,3,3,3-hexafluoropropane, 9,9-bis-(4-aminophenyl)fluorene and the like, aliphatic diamines such as tetramethylenediamine, hexamethylenediamine and the like, alicyclic diamines such as cyclohexanediamine, isophoronediamine, norbornanediamine, bis-(4-aminocyclohexyl)methane, bis-(4-amino-3-methylcyclohexyl)methane, and the like. Furthermore, there is no objection to polymerization reactions where ≧1 type of such diamines are used. Additionally, examples that can be named of diamines that are particularly preferred among these diamines include para-phenylene diamine (PPD), meta-phenylene diamine (MPDA), 4,4'-diaminodiphenylmethane (MDA), 3,3'-diaminodiphenylsulfone (33DDS), 4,4'-diaminodiphenylsulfone (44DDS), 3,4'-diaminodiphenyl ether (34ODA), 4,4'-diaminodiphenyl ether (ODA), 1,3-bis-(3-aminophenoxy)benzene (133APB), 1,3-bis-(4-aminophenoxy)benzene (134APB), bis-[4-(3-aminophenoxy)phenyl]sulfone (BAPSM), bis-[4-(4-aminophenoxy)phenyl]sulfone (BAPS) and 2,2-bis-[4-(4-aminophenoxy)phenyl]propane (BAPP).

Moreover, examples of tetracarboxylic acid dianhydride that are suitable for use in the present invention that can be named include aromatic tetracarboxylic acid dianhydrides such as pyromellitic acid dianhydride (PMDA), 1,2,5,6-naphthalenetetracarboxylic acid dianhydride, 1,4,5,8-naphthalenetetracarboxylic acid dianhydride, 2,3,6,7-naphthalenetetracarboxylic acid dianhydride, 2,2',3,3'-biphenyltetracarboxylic acid dianhydride, 2,3,3',4'-biphenyltetracarboxylic acid dianhydride, 3,3',4,4'-biphenyltetracarboxylic acid dianhydride (BPDA), 2,2',3,3'-benzophenonetetracarboxylic acid dianhydride, 2,3,3',4'-benzophenonetetracarboxylic acid dianhydride, 3,3',4,4'-benzophenonetetracarboxylic acid dianhydride (BTDA), bis-(3,4-dicarboxyphenyl)sulfone dianhydride, bis-(2,3-dicarboxyphenyl)methane dianhydride, bis-(3,4-dicarboxyphenyl)methane dianhydride, 1,1-bis-(2,3-dicarboxyphenyl)ethane dianhydride, 1,1-bis-(3,4-dicarboxyphenyl)ethane dianhydride, 2,2-bis-[3,4-(dicarboxyphenoxy)phenyl]propane dianhydride (BPADA), 4,4'-(hexafluoroisopropylidene)diphthalic dianhydride, oxydiphthalic anhydride (ODPA), bis-(3,4-dicarboxyphenyl)sulfone dianhydride, bis-(3,4-dicarboxyphenyl)sulfoxide dianhydride, thiodiphthalic anhydride, 3,4,9,10-perylenetetracarboxylic acid dianhydride, 2,3,6,7-anthracenetetracarboxylic acid dianhydride, 1,2,7,8-phenanthrolinetetracarboxylic acid dianhydride, 9,9-bis-(3,4-dicarboxyphenyl)fluorenetetracarboxylic acid dianhydride, 9,9-bis-[4-(3,4'-dicarboxyphenoxy)phenyl]fluorenetetracarboxylic acid dianhydride and the like, and cyclobutanetetracarboxylic acid dianhydride, 1,2,3,4-cyclopentanetetracarboxylic acid dianhydride, 2,3,4,5-tetrahydrofurantetracarboxylic acid dianhydride, 1,2,4,5-cyclohexanetetracarboxylic acid dianhydride, 3,4-dicarboxy-1-cyclohexylsuccinic acid dianhydride, 3,4-dicarboxy-1,2,3,4-tetrahydro-1-naphthalenesuccinic acid dianhydride and the like. In addition, it is also satisfactory for such tetracarboxylic acid dianhydrides to be the ester compounds from being allowed to react with alcohols such as methanol, ethanol and the like. Furthermore, there is no objection to polymerization reactions where $\geq 1$ type of such tetracarboxylic acid dianhydrides are used. Additionally, examples among these that can be named of particularly preferred tetracarboxylic acid dianhydrides include pyromellitic acid dianhydride (PMDA), 3,3',4,4'-biphenyltetracarboxylic acid dianhydride (BPDA), 3,3',4,4'-benzophenonetetracarboxylic acid dianhydride (BTDA), 2,2-bis-[3,4-(dicarboxyphenoxy)phenyl]propane dianhydride (BPADA) and oxydiphthalic anhydride (ODPA).

Moreover, examples of polar solvents suitable for use in the present invention that can be named include N,N-dimethylformamide, N,N-dimethylacetamide, N,N-diethylacetamide, N-methyl-2-pyrrolidone, 1,3-dimethyl-2-imidazolidinone, N-methylcaprolactam, hexamethylphosphoric triamide, 1,2-dimethoxyethane, diglyme, triglyme and the like. In addition, examples that can be named that are particularly preferred among these solvents include N,N-dimethylacetamide (DMAC) and N-methyl-2-pyrrolidone (NMP). Furthermore, these solvents can optionally be used either individually or in mixtures, and can also be mixed with other aromatic hydrocarbon solvents such as, for example, toluene, xylene and the like.

Additionally, while manufacturing the conductive paste of the present invention, within the scope that is not detrimental to the essence of the present invention, it is acceptable to add resins such as polyamide-imides, poly(ether sulfones) and the like.

In manufacturing the conductive paste of the present invention, without any particular limitation, there are addition methods for the conductive particulate and addition methods for the metal capture agent. As the methods for addition to the polyimide precursor solution naturally, methods can be adopted in which these are added beforehand in a solvent when the polyimide precursor solution is being manufactured.

The amount of metal capture agent added is preferably $\geq 0.01$ wt % and $\leq 10$ wt % based on the solids content of the polyimide precursor solution. If the amount of metal capture agent added is <0.01 wt % based on the solids content of the polyimide precursor solution, the metal capture agent will be unable to capture the metal. Moreover, if the amount of metal capture agent added is more than 10 wt % based on the solids content of the polyimide precursor solution, the conductive particulate will sometimes be able to flocculate, which is not desirable.

In the manufacturing of the conductive paste of the present invention, within the scope that is not detrimental to the essence of the present invention, it is satisfactory to add commonly known additives such as fillers, pigments, pigment dispersing agents, solid lubricants, anti-settling agents, leveling agents, surface modification agents, water absorption agents, gelation inhibiting agents, oxidation inhibiting agents, ultraviolet radiation absorbing agents, light stabilizing agents, plasticizers, color difference prevention agents, anti-skinning agents, surfactants, antistatic agents, antifoaming agents, antibacterial agents, mildew-proofing agents, preservative agents, thickening agents and the like.

The conductive coating or film of the present invention is formed from the conductive paste of the present invention, and is heat-treated. Furthermore, in a conductive coating or film molded in this manner, the conductive particles that are in a state of being captured in the capture agent are dispersed within the polyimide resin.

As the method for molding a conductive coating from the conductive paste, general methods commonly known to those skilled in the art are satisfactory, for example, including the method of molding a polyimide coating from the polyimide precursor solution or the like. For example, depending on the requirements, after carrying out treatments on the conductive paste such as defoaming, filtering and the like, the conductive paste is applied onto the base material (for example, a heat-resistant substrate, flexible heat-resistant film, or the like) using a method such as the doctor blade method, screen printing, flow casting or the like. Then, this conductive paste undergoes drying by heating, where the imidization progresses by heating gradually or stepwise from 300 degrees C. to 450 degrees C. Furthermore, at this time, it is satisfactory to use a chemical imidization method simultaneously as the imidization progresses by adding greater than stoichiometric quantities of dehydrating agents and imidization catalysts to the conductive paste. The conductive paste of the present invention has superior adhesiveness with the base material, and after coating onto the base material it is possible to mold the integrated conductive coating tightly by completing the imidization.

In addition, as the method for manufacturing a conductive film from the conductive paste, general methods commonly known to those skilled in the art are satisfactory, for example, including the method of molding a polyimide film from a polyimide precursor solution and the like. For example, depending on the requirements, after carrying out treatments on the conductive paste such as defoaming, filtering and the like, the conductive paste can be flow cast or cast coated with a T-die, doctor blade or the like onto a heat-resistant support body such as a plate, drum, endless belt or the like. Then, after drying by heating on the support body until this conductive paste becomes a self-supporting gel film, this gel film is delaminated from the support body, and the gel film is attached top a metal frame, tenter or the like, and the imidization progresses with heating gradually or stepwise from 300 degrees C. to 450 degrees C. Furthermore, at this time, it is satisfactory to use a chemical imidization method simultaneously as the imidization progresses by adding greater than stoichiometric quantities of dehydrating agents and imidization catalysts to the conductive paste.

The coating thickness of the conductive coating or film can be decided as desired, but usually will be on the order of 1 µm~125 µm. Then, using the conductive paste of the present invention, a highly flexible conductive coating or film is obtained even when the coating thickness if 50 µm~125 µm. Furthermore, "high flexibility" in the present invention means that for conductive films and for conductive coatings that are formed onto a flexible substrate such as a Kapton™ film or Upilex™ film or the like, even when wound on a cylinder with a diameter of 5 mm, defects such as becoming broken or developing cracks or the like are absent.

It is desirable for the volume resistivity of the conductive coatings or films of the present invention to be $\geq 2 \times 10^{-6}$ Ω·cm and $\leq 1 \times 10^2$ Ω·cm. If the volume resistivity of the conductive coatings or films is within this range, when formed into a conductive circuit such as by screen printing or the like as well as when molded as a coating in the power supply terminal connector of an electrical circuit to form the conducting medium with electricity flowing positively, i.e. an electrical wire or an electric circuit, superior conductivity can be maintained.

The present invention is explained in more concrete terms based on the working examples below. Furthermore, unless stated separately, after the conductive paste prepared in each of the working examples and comparative examples has been cast on a glass plate, the conductive films prepared in each of the working examples and comparative examples are formed by demolding after drying in a drying oven at 120 degrees C. for 30 minutes and at 200 degrees C. for 30 minutes, then by attaching to a metal frame and heating sequentially at 250 degrees C. for 30 minutes, at 300 degrees C. for 30 minutes and at 350 degrees C. for 30 minutes for the imidization.

Additionally, the volume resistivity of the conductive films was measured in compliance with JIS K7194, using Rorester-GP MCP-T610 manufactured by Mitsubishi Chemical Corporation.

Moreover, flexibility was evaluated on whether or not defects such as becoming broken or developing cracks or the like were produced in these conductive films or conductive coatings when the conductive films or the conductive coatings formed on flexible substrates such as Kapton™ film or Upilex™ film or the like, were wound onto a cylinder with a diameter of 5 mm. For the tables below, an "○" symbol is placed in the flexibility evaluation column when no breaking or cracks were produced, a "Δ" symbol is placed there when some breaking or cracks were produced, and an "X" symbol is placed there when the conductive coating could not be formed in the first place.

Working Example 1

8.77 g of silver-covered carbon powder (AG/GCM-10, Mitsubishi Materials, average particle diameter 10 µm) was added to 40 g of RC5063 of polyimide precursor solution (I.S.T., composition BPDA/PPD, 17.5 wt % of the solids fraction), and this was stirred for 15 minutes. Next, to this silver-covered carbon powder-containing polyimide precursor solution was added a solution of 0.018 g (0.25 wt % based on the solids content of the polyimide precursor solution) of 2-mercaptopyrimidine (Wako Pure Chemicals, 2MP) dissolved in 10 g of N-methyl-2-pyrrolidone (Mitsubishi Chemical), and this was stirred for 8 hours to yield a conductive paste. Then, this conductive paste was heat-treated to yield a high-flexibility conductive film. The results are shown in Table 1.

Working Example 2

7.77 g of the silver-covered carbon powder of Working Example 1 was added to 40 g of RC5019 of polyimide precursor solution (I.S.T., composition PMDA/ODA, 15.5 wt % of the solids fraction), and this was stirred for 15 minutes. Next, to this silver-covered carbon powder-containing polyimide precursor solution was added a solution of 0.016 g (0.25 wt % based on the solids content of the polyimide precursor solution) of 2-mercaptopyrimidine (2MP) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 3

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.018 g (0.25 wt % based on the solids content of the polyimide precursor solution) of 4,6-dimethylpyrimidine-2-thiol (Wako Pure Chemicals, DMPT) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 4

7.77 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.016 g (0.25 wt % based on the solids content of the polyimide precursor solution) of 4,6-dimethylpyrimidine-2-thiol (DMPT) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 5

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.018 g (0.25 wt % based on the solids content of the polyimide precursor solution) of 2-amino-1,3,5-triazine-4,6-dithiol (Alfa-Aesar, ATDT) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 6

7.77 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.016 g (0.25 wt % based on the solids content of the polyimide precursor solution) of 2-amino-1,3,5-triazine-4,6-dithiol (ATDT) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 7

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.018 g (0.25 wt % based on the solids content of the polyimide precursor solution) of 2-di-n-butylamino-4,6-dimercapto-1,3,5-triazine (Wako Pure Chemicals, DBDMT) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 8

7.77 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.016 g (0.25 wt % based on the solids content of the polyimide precursor solution) of 2-di-n-butylamino-4,6-dimercapto-1,3,5-triazine (DBDMT) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 9

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.018 g (0.25 wt % based on the solids content of the polyimide precursor solution) of trithiocyanuric acid (Wako Pure Chemicals, TTCA) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 10

7.77 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.016 g (0.25 wt % based on the solids content of the polyimide precursor solution) of trithiocyanuric acid (TTCA) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 11

13.15 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.018 g (0.25 wt % based on the solids content of the polyimide precursor solution) of 2-amino-1,3,5-triazine-4,6-dithiol (ATDT) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 12

11.65 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.016 g (0.25 wt % based on the solids content of the polyimide precursor solution) of 2-amino-1,3,5-triazine-4,6-dithiol (ATDT) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 13

5.64 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.018 g (0.25 wt % based on the solids content of the polyimide precursor solution) of 2-amino-1,3,5-triazine-4,6-dithiol (ATDT) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 14

4.99 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.016 g (0.25 wt % based on the solids content of the polyimide precursor solution) of 2-amino-1,3,5-triazine-4,6-dithiol (ATDT) dissolved in 10 g of N-methyl-2-pyrrolidone, and this was stirred for 8 hours to yield a conductive paste. Then, this conductive paste was heat-treated to yield a high-flexibility conductive film. The results are shown in Table 1.

Working Example 15

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.0035 g (0.05 wt % based on the solids content of the polyimide precursor solution) of 2-amino-1,3,5-triazine-4,6-dithiol (ATDT) dissolved in 10 g of N-methyl-2-pyrrolidone, and this was stirred for 8 hours to yield a conductive paste. Then, this conductive paste was heat-treated to yield a high-flexibility conductive film. The results are shown in Table 2.

Working Example 16

7.77 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.0031 g (0.05 wt % based on the solids content of the polyimide precursor solution) of 2-amino-1,3,5-triazine-4,6-dithiol (ATDT) dissolved in 10 g of N-methyl-2-pyrrolidone, and this was stirred for 8 hours to yield a conductive paste. Then, this conductive paste was heat-treated to yield a high-flexibility conductive film. The results are shown in Table 2.

Working Example 17

7.77 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.37 g (6.0 wt % based on the solids content of the polyimide precursor solution) of 2-di-n-butylamino-4,6-dimercapto-1,3,5-triazine (DBDMT) dissolved in 10 g of N-methyl-2-pyrrolidone, and this was stirred for 8 hours to yield a conductive paste. Then, this conductive paste was heat-treated to yield a high-flexibility conductive film. The results are shown in Table 2.

Working Example 18

326.96 g of N-methyl-2-pyrrolidone and 27.99 g of 4,4'-diaminodiphenyl ether (Wako Pure Chemicals, ODA) was introduced into a 500-mL separable flask, and this was stirred until complete dissolution. Next, 45.05 g of 3,3',4,4'-benzophenonetetracarboxylic acid dianhydride (Daicel Chemical Industries, BTDA) was introduced to this diamine solution, and this was stirred for 24 hours to prepare a polyimide precursor solution with a 17 wt % solids content. Then, 8.52 g of the silver-covered carbon powder of Working Example 1 was added to 40 g of this polyimide precursor solution, and this was stirred for 15 minutes. Next, to this silver-covered carbon powder-containing polyimide precursor solution was added a solution of 0.017 g (0.25 wt % based on the solids content of the polyimide precursor solution) of 2-amino-1,3,5-triazine-4,6-dithiol (ATDT) dissolved in 10 g of N-methyl-2-pyrrolidone, and this was stirred for 8 hours to yield a conductive paste. Then, this conductive paste was heat-treated to yield a high-flexibility conductive film. The results are shown in Table 2.

Working Example 19

31.03 g of N,N-dimethylacetamide (Wako Pure Chemicals), 8.82 g of ethanol (Wako Pure Chemicals) and 30.84 g of 3,3',4,4'-benzophenonetetracarboxylic acid dianhydride was introduced into a 500-mL separable flask, and this was stirred for 2 hours at 80 degrees C. for complete dissolution. Next, 19.16 g of 4,4'-diaminodiphenyl ether was introduced to this tetracarboxylate ester compound solution, and this was stirred for 2 hours at 80 degrees C. to produce a polyimide precursor solution with a 46.7 wt % solids content. Then, 2.92 g of the silver-covered carbon powder of Working Example 1 was added to 5 g of this polyimide precursor solution, and this was stirred for 15 minutes. Next, to this silver-covered carbon powder-containing polyimide precursor solution was added a solution of 0.0023 g (0.1 wt % based on the solids content of the polyimide precursor solution) of 2-amino-1,3,5-triazine-4,6-dithiol (ATDT) dissolved in 0.5 g of N,N-dimethylacetamide, and this was stirred for 8 hours to yield a conductive paste. Then, this conductive paste was flow cast onto a Upilex™ film (Ube Industries, thickness 50 μm), and after drying at 120 degrees C. for 30 minutes and 200 degrees C. for 30 minutes, this was fired sequentially at 250 degrees C. for 30 minutes, 300 degrees C. for 30 minutes and 350 degrees C. for 30 minutes to form a conductive coating on a Upilex™ film. The results are shown in Table 2.

Working Example 20

2.5 g of silver-covered hollow glass powder (AG/GB, Mitsubishi Materials, average particle diameter 30 μm) was added to 40 g of RC5063 of polyimide precursor solution, and this was stirred for 15 minutes. Next, to this silver-covered hollow glass powder-containing polyimide precursor solution was added a solution of 0.018 g (0.25 wt % based on the solids content of the polyimide precursor solution) of 2-amino-1,3,5-triazine-4,6-dithiol (ATDT) dissolved in 10 g of N-methyl-2-pyrrolidone, and this was stirred for 8 hours to yield a conductive paste. Then, this conductive paste was heat-treated to yield a high-flexibility conductive film. The results are shown in Table 2.

Working Example 21

2.22 g of the silver-covered hollow glass powder of Working Example 20 was added to 40 g of RC5019 of polyimide precursor solution, and this was stirred for 15 minutes. Next, to this silver-covered hollow glass powder-containing polyimide precursor solution was added a solution of 0.016 g (0.25 wt % based on the solids content of the polyimide precursor solution) of 2-amino-1,3,5-triazine-4,6-dithiol (ATDT) dissolved in 10 g of N-methyl-2-pyrrolidone, and this was stirred for 8 hours to yield a conductive paste. Then, this conductive paste was heat-treated to yield a high-flexibility conductive film. The results are shown in Table 2.

Working Example 22

4.07 g of silver powder (AgC-A, Fukuda Metal Foil & Powder, average particle diameter 3.1 μm) was added to 5 g of RC5019 of polyimide precursor solution, and this was stirred for 15 minutes. Next, to this silver powder-containing polyimide precursor solution was added a solution of 0.0019 g (0.25 wt % based on the solids content of the polyimide precursor solution) of 2-amino-1,3,5-triazine-4,6-dithiol (ATDT) dissolved in 2.5 g of N-methyl-2-pyrrolidone, and this was stirred for 8 hours to yield a conductive paste. Then, this conductive paste was flow cast onto a Kapton™ film (DuPont, thickness 2 mil), and after drying at 120 degrees C. for 30 minutes and 200 degrees C. for 30 minutes, this was fired sequentially at 250 degrees C. for 30 minutes, 300 degrees C. for 30 minutes, 350 degrees C. for 30 minutes and 400 degrees C. for 60 minutes to form a conductive coating on a Kapton™ film. The results are shown in Table 2.

Working Example 23

4.71 g of the silver powder of Working Example 22 was added to 5 g of RC5063 of polyimide precursor solution, and this was stirred for 15 minutes. Next, to this silver powder-containing polyimide precursor solution was added a solution of 0.0022 g (0.25 wt % based on the solids content of the polyimide precursor solution) of 2-amino-1,3,5-triazine-4,6-dithiol (ATDT) dissolved in 2.5 g of N-methyl-2-pyrrolidone, and this was stirred for 8 hours to yield a conductive paste.

Then, in the same manner as in Working Example 22, this conductive paste was flow cast, heat-treated, and formed into a conductive coating on a Kapton™ film. The results are shown in Table 2.

Working Example 24

4.07 g of the silver powder of Working Example 22 was added to 5 g of RC5019 of polyimide precursor solution, and this was stirred for 15 minutes. Next, to this silver powder-containing polyimide precursor solution was added a solution of 0.0019 g (0.25 wt % based on the solids content of the polyimide precursor solution) of 2-mercaptopyrimidine (2MP) dissolved in 2.5 g of N-methyl-2-pyrrolidone, and this was stirred for 8 hours to yield a conductive paste. Then, in the same manner as in Working Example 22, this conductive paste was flow cast, heat-treated, and formed into a conductive coating on a Kapton™ film. The results are shown in Table 2.

Working Example 25

4.71 g of the silver powder of Working Example 22 was added to 5 g of RC5063 of polyimide precursor solution, and this was stirred for 15 minutes. Next, to this silver powder-containing polyimide precursor solution was added a solution of 0.0022 g (0.25 wt % based on the solids content of the polyimide precursor solution) of 2-mercaptopyrimidine (2MP) dissolved in 2.5 g of N-methyl-2-pyrrolidone, and this was stirred for 8 hours to yield a conductive paste. Then, in the same manner as in Working Example 22, this conductive paste was flow cast, heat-treated, and formed into a conductive coating on a Kapton™ film. The results are shown in Table 2.

Working Example 26

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.114 g (0.25 wt % of the trithiocyanuric acid trisodium salt based on the solids content of polyimide precursor solution) of a 15 wt % aqueous solution of trithiocyanuric acid trisodium salt (Fluka, TTCA-3Na) dissolved in 10 g of N-methyl-2-pyrrolidone, and this was stirred for 8 hours to yield a conductive paste. Then this conductive paste was heat-treated to yield a high-flexibility conductive film. The results are shown in Table 2.

Working Example 27

7.77 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.128 g (0.25 wt % of the trithiocyanuric acid trisodium salt based on the solids content of polyimide precursor solution) of a 15 wt % aqueous solution of trithiocyanuric acid trisodium salt (TTCA-3Na) dissolved in 10 g of N-methyl-2-pyrrolidone, and this was stirred for 8 hours to yield a conductive paste. Then, this conductive paste was heat-treated to yield a high-flexibility conductive film. The results are shown in Table 2.

Working Example 28

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.018 g (0.25 wt % based on the solids content of the polyimide precursor solution) of 2-mercaptobenzimidazole (Wako Pure Chemicals, 2MBZ) dissolved in 10 g of N-methyl-2-pyrrolidone, and this was stirred for 8 hours to yield a conductive paste. Then, this conductive paste was heat-treated to yield a high-flexibility conductive film. The results are shown in Table 3.

Working Example 29

7.77 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.016 g (0.25 wt % based on the solids content of the polyimide precursor solution) of 2-mercaptobenzimidazole (2MBZ) dissolved in 10 g of N-methyl-2-pyrrolidone, and this was stirred for 8 hours to yield a conductive paste. Then, this conductive paste was heat-treated to yield a high-flexibility conductive film. The results are shown in Table 3.

Working Example 30

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.018 g (0.25 wt % based on the solids content of the polyimide precursor solution) of 2-mercapto-1-methylimidazole (2MMZ) dissolved in 10 g of N-methyl-2-pyrrolidone, and this was stirred for 8 hours to yield a conductive paste. Then, this conductive paste was heat-treated to yield a high-flexibility conductive film. The results are shown in Table 3.

Working Example 31

7.77 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.016 g (0.25 wt % based on the solids content of the polyimide precursor solution) of 2-mercapto-1-methylimidazole (2MMZ) dissolved in 10 g of N-methyl-2-pyrrolidone, and this was stirred for 8 hours to yield a conductive paste. Then, this conductive paste was heat-treated to yield a high-flexibility conductive film. The results are shown in Table 3.

Working Example 32

2.5 g of the silver-covered hollow glass powder of Working Example 20 was added to 40 g of RC5063 of polyimide precursor solution, and this was stirred for 15 minutes. Next, to this silver-covered hollow glass powder-containing polyimide precursor solution was added a solution of 0.018 g (0.25 wt % based on the solids content of the polyimide precursor solution) of 2-mercaptobenzimidazole (2MBZ) dissolved in 10 g of N-methyl-2-pyrrolidone, and this was stirred for 8 hours to yield a conductive paste. Then, this conductive paste was heat-treated to yield a high-flexibility conductive film. The results are shown in Table 3.

Working Example 33

2.22 g of the silver-covered hollow glass powder of Working Example 20 was added to 40 g of RC5019 of polyimide precursor solution, and this was stirred for 15 minutes. Next, to this silver-covered hollow glass powder-containing polyimide precursor solution was added a solution of 0.018 g (0.25 wt % based on the solids content of the polyimide precursor solution) of 2-mercaptobenzimidazole (2MBZ) dissolved in 10 g of N-methyl-2-pyrrolidone, and this was stirred for 8 hours to yield a conductive paste. Then, this conductive paste was heat-treated to yield a high-flexibility conductive film. The results are shown in Table 3.

Working Example 34

31.03 g of N,N-dimethylacetamide (Wako Pure Chemicals), 8.82 g of ethanol (Wako Pure Chemicals) and 30.84 g of 3,3',4,4'-benzophenonetetracarboxylic acid dianhydride was introduced into a 500-mL separable flask, and this was stirred for 2 hours at 80 degrees C. for complete dissolution. Next, 19.16 g of 4,4'-diaminodiphenyl ether was introduced to this tetracarboxylate ester compound solution, and this was stirred for 2 hours at 80 degrees C. to produce a polyimide precursor solution with a 46.7 wt % solids content. Then, 2.92 g of the silver-covered carbon powder of Working Example 1 was added to 5 g of this polyimide precursor solution, and this was stirred for 15 minutes. Next, to this silver-covered carbon powder-containing polyimide precursor solution was added a solution of 0.0023 g (0.1 wt % based on the solids content of the polyimide precursor solution) of 2-mercaptobenzimidazole (2MBZ) dissolved in 0.5 g of N,N-dimethylacetamide, and this was stirred for 8 hours to yield a conductive paste. Then, this conductive paste was flow cast onto a Upilex™ film (Ube Industries, thickness 50 μm), and after drying at 120 degrees C. for 30 minutes and 200 degrees C. for 30 minutes, this was fired sequentially at 250 degrees C. for 30 minutes, 300 degrees C. for 30 minutes and 350 degrees C. for 30 minutes to form a conductive coating on a Upilex™ film. The results are shown in Table 3.

Working Example 35

4.07 g of the silver powder of Working Example 22 was added to 5 g of RC5019 of polyimide precursor solution, and this was stirred for 15 minutes. Next, to this silver powder-containing polyimide precursor solution was added a solution of 0.0019 g (0.25 wt % based on the solids content of the polyimide precursor solution) of 2-mercaptobenzimidazole (2MBZ) dissolved in 2.5 g of N-methyl-2-pyrrolidone, and this was stirred for 8 hours to yield a conductive paste. Then, this conductive paste was flow cast onto a Kapton™ film (DuPont, thickness 2 mil), and after drying at 120 degrees C. for 30 minutes and 200 degrees C. for 30 minutes, this was fired sequentially at 250 degrees C. for 30 minutes, 300 degrees C. for 30 minutes, 350 degrees C. for 30 minutes and 400 degrees C. for 60 minutes to form a conductive coating on a Kapton™ film. The results are shown in Table 3.

Comparative Example 1

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added 10 g of N-methyl-2-pyrrolidone, and this was stirred for 8 hours to yield a conductive paste. Then, this conductive paste was heat-treated, and a film preparation attempt was made, but a flocculent powder resulted and a film could not be obtained (see Table 4).

Comparative Example 2

7.77 g of the silver-covered carbon powder of Working Example 1 was added to 40 g of RC5019 of polyimide precursor solution, and this was stirred for 15 minutes. Next, to this silver-covered carbon powder-containing polyimide precursor solution was added 10 g of N-methyl-2-pyrrolidone, and this was stirred for 8 hours to yield a conductive paste. Then, this conductive paste was heat-treated, and a film preparation attempt was made, but a flocculent powder resulted and a film could not be obtained (see Table 4).

Comparative Example 3

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.018 g of the silane coupling agent of (3-glycidoxypropyl)trimethoxysilane (Shin-Etsu Silicone) dissolved in 10 g of N-methyl-2-pyrrolidone, and this was stirred for 8 hours to yield a conductive paste. Then, this conductive paste was heat-treated, and a film preparation attempt was made, but a flocculent film resulted (see Table 4).

Comparative Example 4

7.77 g of the silver-covered carbon powder of Working Example 1 was added to 40 g of RC5019 of polyimide precursor solution, and this was stirred for 15 minutes. Next, to this silver-covered carbon powder-containing polyimide precursor solution was added a solution of 0.016 g of the silane coupling agent of (3-glycidoxypropyl)trimethoxysilane dissolved in 10 g of N-methyl-2-pyrrolidone, and this was stirred for 8 hours to yield a conductive paste. Then, this conductive paste was heat-treated, and a film preparation attempt was made, but a flocculent film resulted (see Table 4).

Comparative Example 5

8.52 g of the silver-covered carbon powder of Working Example 1 was added to 40 g of the polyimide precursor solution prepared in Working Example 19, and this was stirred for 15 minutes. Next, to this silver-covered carbon powder-containing polyimide precursor solution was added 10 g of N-methyl-2-pyrrolidone, and this was stirred for 8 hours to yield a conductive paste. Then, this conductive paste was heat-treated, and a film preparation attempt was made, but only an extremely fragile film could be obtained (see Table 4).

Comparative Example 6

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.0021 g (0.003 wt % based on the solids content of the polyimide precursor solution) of 2-amino-1,3,5-triazine-4,6-dithiol (ATDT) dissolved in 10 g of N-methyl-2-pyrrolidone, and this was stirred for 8 hours to yield a conductive paste. Then, the polyimide film prepared by heat treatment of this conductive paste was fragile. The volume resistivity was $7 \times 10^{-4}$ Ω·cm (see Table 4).

Comparative Example 7

4.07 g of the silver powder of Working Example 22 was added to 5 g of RC5019 of polyimide precursor solution, and this was stirred for 15 minutes. Next, to this silver powder-containing polyimide precursor solution was added 2.5 g of N-methyl-2-pyrrolidone, and this was stirred for 8 hours to yield a conductive paste. Then, this conductive paste was flow cast onto a Kapton™ film, and after drying in a drying oven at 120 degrees C. for 30 minutes and 200 degrees C. for 30 minutes, when this was fired sequentially at 250 degrees C. for 30 minutes, 300 degrees C. for 30 minutes, 350 degrees C. for 30 minutes and 400 degrees C. for 60 minutes, it became a flocculent film and delaminated from the Kapton™ film (see Table 4).

Comparative Example 8

4.71 g of the silver powder of Working Example 22 was added to 5 g of RC5063 of polyimide precursor solution, and this was stirred for 15 minutes. Next, to this silver powder-containing polyimide precursor solution was added 2.5 g of N-methyl-2-pyrrolidone, and this was stirred for 8 hours to yield a conductive paste. Then, this conductive paste was flow cast onto a Kapton™ film, and after drying in a drying oven at 120 degrees C. for 30 minutes and 200 degrees C. for 30 minutes, when this was fired sequentially at 250 degrees C. for 30 minutes, 300 degrees C. for 30 minutes, 350 degrees C. for 30 minutes and 400 degrees C. for 60 minutes, it became a flocculent film and delaminated from the Kapton™ film (see Table 4).

Comparative Example 9

8.77 g of the silver-covered carbon powder of Working Example 1 was added to 40 g of RC5063 of polyimide precursor solution, and this was stirred for 15 minutes. Next, to this silver-covered carbon powder-containing polyimide precursor solution was added a solution of 0.0021 g (0.003 wt % based on the solids content of the polyimide precursor solution) of 2-mercaptobenzimidazole (2MBZ) dissolved in 10 g of N-methyl-2-pyrrolidone, and this was stirred for 8 hours to yield a conductive paste. Then, the polyimide film prepared by heat treatment of this conductive paste was fragile. The volume resistivity was $7\times10^{-4}$ Ω·cm (see Table 4).

TABLE 1

| | PI precurser composition | Thickness (μm) | Conductive particulate | Metal capture agent Substance name | Amt. added (wt %) | Volume resistivity (Ω·cm) | Flexibility |
|---|---|---|---|---|---|---|---|
| Working Example 1 | BPDA/PPD | 75 | A | 2MP | 0.25 | $3 \times 10^{-3}$ | ○ |
| Working Example 2 | PMDA/ODA | 80 | A | 2MP | 0.25 | $4 \times 10^{-4}$ | ○ |
| Working Example 3 | BPDA/PPD | 85 | A | DMPT | 0.25 | $1.8 \times 10$ | ○ |
| Working Example 4 | PMDA/ODA | 85 | A | DMPT | 0.25 | $8 \times 10^{-4}$ | ○ |
| Working Example 5 | BPDA/PPD | 75 | A | ATDT | 0.25 | $2 \times 10^{-2}$ | ○ |
| Working Example 6 | PMDA/ODA | 70 | A | ATDT | 0.25 | $5 \times 10^{-4}$ | ○ |
| Working Example 7 | BPDA/PPD | 95 | A | DBDMT | 0.25 | $5 \times 10^{-4}$ | ○ |
| Working Example 8 | PMDA/ODA | 70 | A | DBDMT | 0.25 | $3 \times 10^{-4}$ | ○ |
| Working Example 9 | BPDA/PPD | 80 | A | TTCA | 0.25 | $1.4 \times 10^{-1}$ | ○ |
| Working Example 10 | PMDA/ODA | 90 | A | TTCA | 0.25 | $1.6 \times 10^{-3}$ | ○ |
| Working Example 11 | BPDA/PPD | 100 | A | ATDT | 0.25 | $3 \times 10^{-3}$ | ○ |
| Working Example 12 | PMDA/ODA | 100 | A | ATDT | 0.25 | $4 \times 10^{-4}$ | ○ |
| Working Example 13 | BPDA/PPD | 80 | A | ATDT | 0.25 | $1.8 \times 10$ | ○ |
| Working Example 14 | PMDA/ODA | 85 | A | ATDT | 0.25 | $4 \times 10^{-3}$ | ○ |

A: Silver-covered carbon, B: Silver-covered hollow glass, C: Silver powder

TABLE 2

| | PI precursor composition | Thickness (μm) | Conductive particulate | Metal capture agent Substance name | Amt. added (wt %) | Volume resistivity (Ω·cm) | Flexibility |
|---|---|---|---|---|---|---|---|
| Working Example 15 | BPDA/PPD | 85 | A | ATDT | 0.05 | $1.8 \times 10^{-3}$ | ○ |
| Working Example 16 | PMDA/ODA | 90 | A | ATDT | 0.05 | $4 \times 10^{-4}$ | ○ |
| Working Example 17 | PMDA/ODA | 75 | A | DBDMT | 6.0 | $1.6 \times 10^{-1}$ | ○ |
| Working Example 18 | BTDA/ODA | 75 | A | ATDT | 0.25 | $1 \times 10^{-3}$ | ○ |

TABLE 2-continued

|  | PI precursor composition | Thickness (μm) | Conductive particulate | Metal capture agent Substance name | Metal capture agent Amt. added (wt %) | Volume resistivity (Ω·cm) | Flexibility |
|---|---|---|---|---|---|---|---|
| Working Example 19 | BTDA/ODA | 75 | A | ATDT | 0.25 | $1.4 \times 10^{-3}$ | ○ |
| Working Example 20 | BPDA/PPD | 95 | B | ATDT | 0.25 | $3.1 \times 10^{-2}$ | ○ |
| Working Example 21 | PMDA/ODA | 95 | B | ATDT | 0.25 | $4 \times 10^{-3}$ | ○ |
| Working Example 22 | PMDA/ODA | 55 | C | ATDT | 0.25 | $3 \times 10^{-6}$ | ○ |
| Working Example 23 | BPDA/PPD | 50 | C | ATDT | 0.25 | $9 \times 10^{-6}$ | ○ |
| Working Example 24 | PMDA/ODA | 55 | C | 2MP | 0.25 | $5 \times 10^{-6}$ | ○ |
| Working Example 25 | BPDA/PPD | 50 | C | 2MP | 0.25 | $8 \times 10^{-6}$ | ○ |
| Working Example 26 | BPDA/PPD | 80 | A | TTCA-3Na | 0.25 | $3 \times 10^{-3}$ | ○ |
| Working Example 27 | PMDA/ODA | 80 | A | TTCA-3Na | 0.25 | $8 \times 10^{-4}$ | ○ |

A: Silver-covered carbon, B: Silver-covered hollow glass, C: Silver powder

TABLE 3

|  | PI precursor composition | Thickness (μm) | Conductive particulate | Metal capture agent Substance name | Metal capture agent Amt. added (wt %) | Volume resistivity (Ω·cm) | Flexibility |
|---|---|---|---|---|---|---|---|
| Working Example 28 | BPDA/PPD | 80 | A | 2MBZ | 0.25 | $4 \times 10^{-2}$ | ○ |
| Working Example 29 | PMDA/ODA | 85 | A | 2MBZ | 0.25 | $7 \times 10^{-4}$ | ○ |
| Working Example 30 | BPDA/PPD | 80 | A | 2MMZ | 0.25 | $2 \times 10^{-2}$ | ○ |
| Working Example 31 | PMDA/ODA | 85 | A | 2MMZ | 0.25 | $7 \times 10^{-4}$ | ○ |
| Working Example 32 | BPDA/PPD | 75 | B | 2MBZ | 0.25 | $3 \times 10^{-2}$ | ○ |
| Working Example 33 | PMDA/ODA | 80 | B | 2MBZ | 0.25 | $4 \times 10^{-2}$ | ○ |
| Working Example 34 | BTDA/ODA | 75 | A | 2MBZ | 0.1 | $2 \times 10^{-2}$ | ○ |
| Working Example 35 | PMDA/ODA | 85 | C | 2MBZ | 0.25 | $4 \times 10^{-6}$ | ○ |

A: Silver-covered carbon, B: Silver-covered hollow glass, C: Silver powder

TABLE 4

|  | PI precursor composition | Thickness (μm) | Conductive particulate | Metal capture agent Substance name | Metal capture agent Amt. added (wt %) | Volume resistivity (Ω·cm) | Flexibility |
|---|---|---|---|---|---|---|---|
| Comparative example 1 | BPDA/PPD | — | A | — | — | — | X |
| Comparative example 2 | PMDA/ODA | — | A | — | — | — | X |
| Comparative example 3 | BPDA/PPD | — | A | Silane coupling agent | — | — | X |
| Comparative example 4 | PMDA/ODA | — | A | Silane coupling agent | — | — | X |

TABLE 4-continued

| | PI precursor composition | Thickness (μm) | Conductive particulate | Metal capture agent Substance name | Amt. added (wt %) | Volume resistivity (Ω·cm) | Flexibility |
|---|---|---|---|---|---|---|---|
| Comparative example 5 | BTDA/ODA | — | A | — | — | — | X |
| Comparative example 6 | BPDA/PPD | 55 | A | ATDT | 0.003 | $7 \times 10^{-4}$ (fragile) | Δ |
| Comparative example 7 | PMDA/ODA | — | C | — | — | — | X |
| Comparative example 8 | BPDA/PPD | — | C | — | — | — | X |
| Comparative example 9 | BPDA/PPD | — | A | 2MBZ | 0.003 | $7 \times 10^{-4}$ (fragile) | Δ |

A: Silver-covered carbon, B: Silver-covered hollow glass, C: Silver powder

INDUSTRIAL APPLICABILITY

As is clear from Tables 1~3, conductive films obtained from the conductive paste of the present invention possess superior conductivity, and maintain flexibility even with a thickness of 50 μm~125 μm and are ductile, combined with the heat resistance and mechanical properties of a polyimide. From such characteristics, the conductive paste of the present invention can be utilized as a paste for printing onto the electrically-conducting circuit of a printed wiring board, a paste for filling through-holes and the like. Furthermore, this conductive paste can be formed into electrode sections such as for sheet heaters and the like, as well as a conductive adhesive material in connectors for a power supply terminal and lead wires for a conducting medium with a positive flow of electricity, i.e. an electrical wire or an electric circuit. Moreover, the conductive films as well as conductive coatings that are formed from this conductive paste can be suitable for application in the removal of static electricity, or as an electromagnetic shield or the like.

The invention claimed is:

1. A conductive paste comprising:
   conductive particles;
   a metal capture agent being at least one or mixtures thereof selected from the group consisting of a pyrimidinethiol compound represented in Chemical Formula (1) shown below, a triazinethiol compound represented in Chemical Formula (2) shown below, and an imidazole compound with a mercapto group, the imidazole compound being free of 2-mercaptobenzimidazole;

[Chemical formula 1]

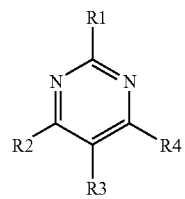

(1)

(where in formula (1), at least one from among R1, R2, R3 and R4 is S—H or S-M, and M is a metal or substituted or unsubstituted ammonium)

[Chemical formula 2]

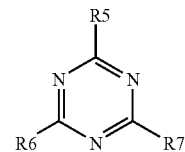

(2)

(where in formula (2), at least one from among R5, R6 and R7 is S—H or S-M, and M is a metal or substituted or unsubstituted ammonium); and
   a polyimide precursor solution.

2. The conductive paste according to claim 1 wherein the conductive particles are formed from core particles and a metal shell covering the core particles.

3. The conductive paste according to claim 2 wherein the metal shell is formed from silver.

4. The conductive paste according to claim 2 wherein the core particle is at least one particle selected from the group consisting of carbon, glass and ceramic.

5. The conductive paste according to any of claims 1 through 4 wherein the imidazole compound with a mercapto group is at least one selected from the group consisting of 2-mercaptoimidazole, 2-mercapto-1-methylimidazole, 2-mercapto-5-methylimidazole, 5-amino-2-mercaptobenzimidazole, 2-mercapto-5-nitrobenzimidazole, 2-mercapto-5-methoxybenzimidazole and 2-mercaptobenzimidazole-5-carboxylic acid.

6. The conductive paste according to any of claims 1 through 4 wherein the additive amount of the metal capture agent is 0.01 wt % to 10 wt % based on the solids content of the polyimide precursor solution.

7. A conductive coating or film that is formed from the conductive paste according to any of claims 1 through 4 being heat-treated.

8. A conductive coating or film comprising:
   a polyimide resin;
   a metal capture agent being at least one or mixtures thereof selected from the group consisting of a pyrimidinethiol compound represented in Chemical Formula (1) shown below, a triazinethiol compound represented in Chemical Formula (2) shown below, and an imidazole compound with a mercapto group, the imidazole compound being free of 2-mercaptobenzimidazole, and dispersed in the polyimide resin

[Chemical formula 1]

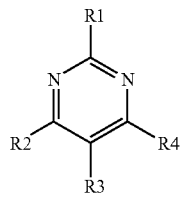
(1)

(where in formula (1), at least one from among R1, R2, R3 and R4 is S—H or S-M, and M is a metal or substituted or unsubstituted ammonium)

[Chemical formula 2]

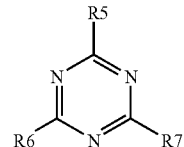
(2)

(where in formula (2), at least one from among R5, R6 and R7 is S—H or S-M, and M is a metal or substituted or unsubstituted ammonium); and conductive particles being in a state of being captured in the metal capture agent within the polyimide resin.

9. The conductive coating or film according to claim 8 wherein the volume resistivity is $\geq 2\times 10^{-6}$ Ω·cm and $\leq 1\times 10^2$ Ω·cm.

10. The conductive coating or film according to claim 8 wherein the imidazole compound with a mercapto group is at least one selected from the group consisting of 2-mercaptoimidazole, 2-mercapto-1-methylimidazole, 2-mercapto-5-methylimidazole, 5-amino-2-mercaptobenzimidazole, 2-mercapto-5-nitrobenzimidazole, 2-mercapto-5-methoxybenzimidazole and 2-mercaptobenzimidazole-5-carboxylic acid.

* * * * *